United States Patent [19]

Tomita et al.

[11] 4,019,905

[45] Apr. 26, 1977

[54] METHOD FOR FORMING FLUORESCENT SCREEN OF COLOR CATHODE RAY TUBES USING FILTER LAYER

[75] Inventors: Yoshifumi Tomita; Kiyoshi Miura; Hiromitu Nakai, all of Mobara, Japan

[73] Assignee: Hitachi, Ltd., Japan

[22] Filed: June 17, 1975

[21] Appl. No.: 587,664

[30] Foreign Application Priority Data

June 17, 1974 Japan .............................. 49-68195

[52] U.S. Cl. .................................. 96/36.1; 427/68
[51] Int. Cl.² .......................................... G03C 5/00
[58] Field of Search ............... 96/36.1, 27 E; 354/1; 427/68

[56] References Cited
UNITED STATES PATENTS

| | | | |
|---|---|---|---|
| 3,287,130 | 11/1966 | Kaplan | 96/36.1 |
| 3,365,292 | 1/1968 | Fiore et al. | 96/36.1 |
| 3,387,975 | 6/1968 | Tamura | 96/36.1 |
| 3,615,461 | 10/1971 | Kaplan | 96/36.1 |
| 3,615,462 | 10/1971 | Szegho et al. | 96/36.1 |
| 3,661,580 | 5/1972 | Mayaud | 96/36.1 |
| 3,881,928 | 5/1975 | Gravesteijn et al. | 96/36.1 |
| 3,884,703 | 5/1975 | Oba et al. | 96/36.1 |
| 3,915,707 | 10/1975 | Gesswein et al. | 96/36.1 |

Primary Examiner—Edward C. Kimlin
Attorney, Agent, or Firm—Craig & Antonelli

[57] ABSTRACT

A filter layer for intercepting the undesired light passage is interleaved between the panel of a color cathode ray tube and the photosensitive phosphor coating, the photosensitive phosphor coating is backwardly exposed through the filter layer to actinic radiation of the back exposure to form phosphor elements with good adhesion and position.

16 Claims, 17 Drawing Figures

FIG. 1
FIG. 2
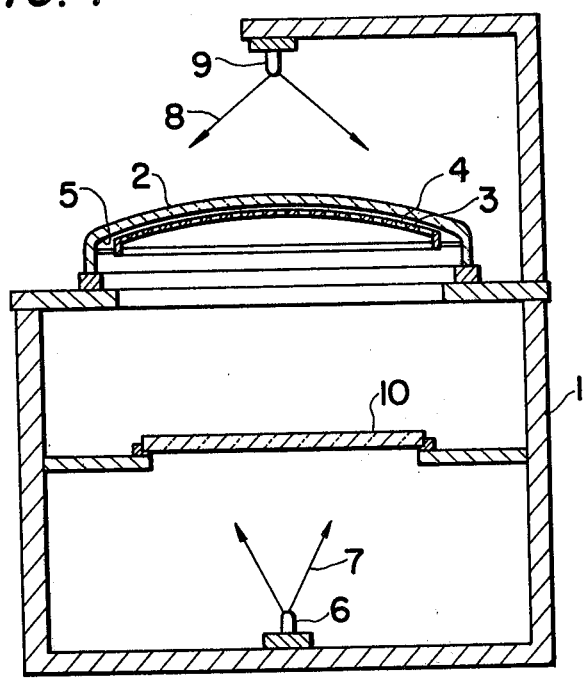
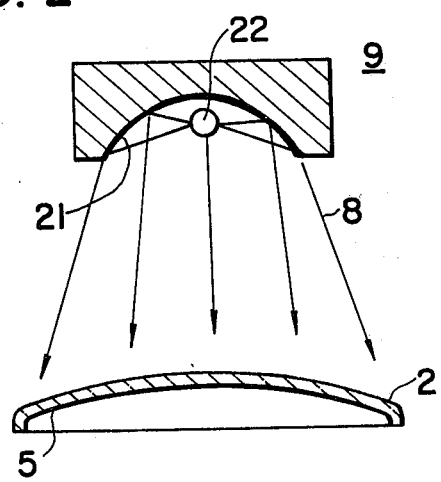

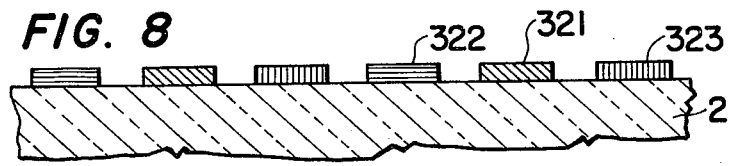
FIG. 8
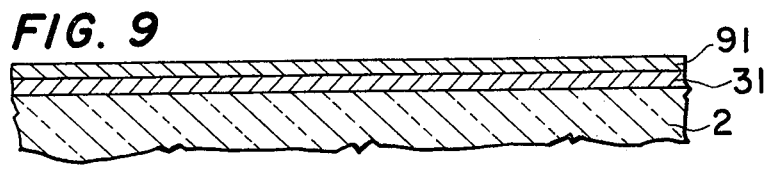
FIG. 9
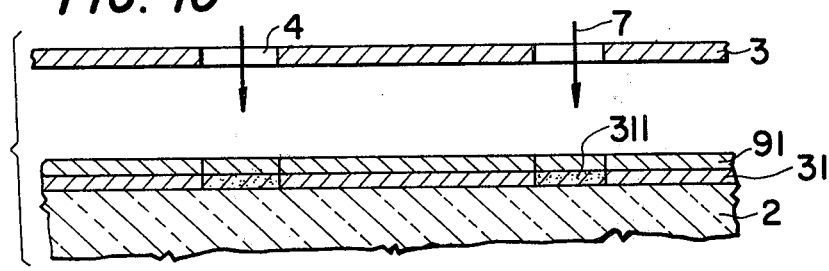
FIG. 10
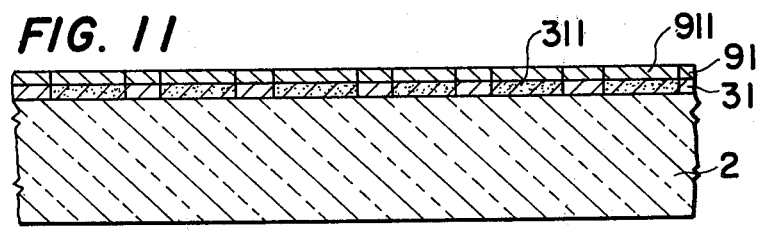
FIG. 11
FIG. 12
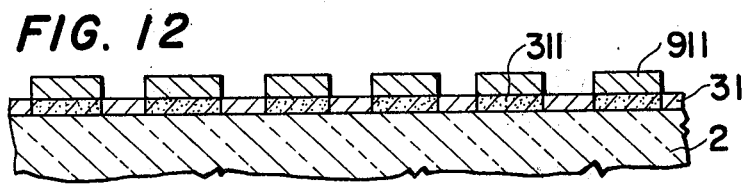
FIG. 13
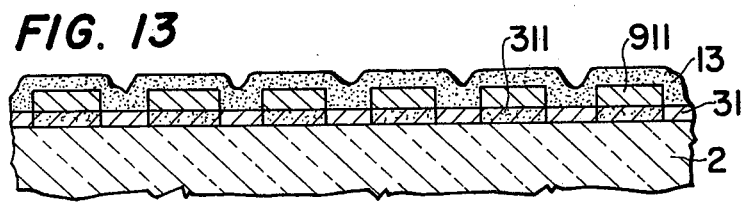

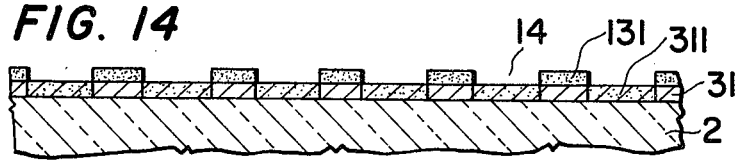
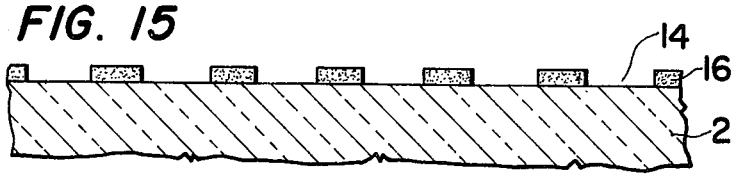
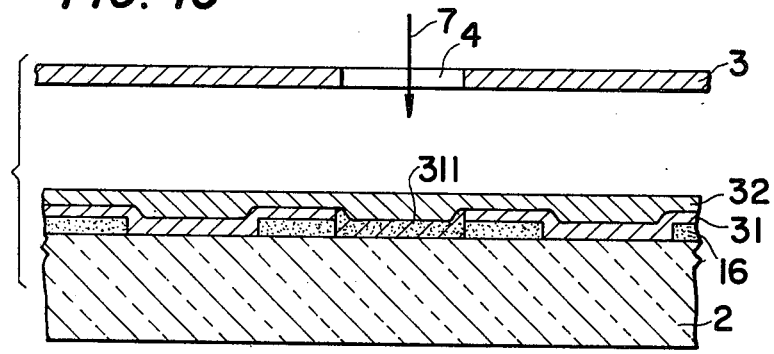
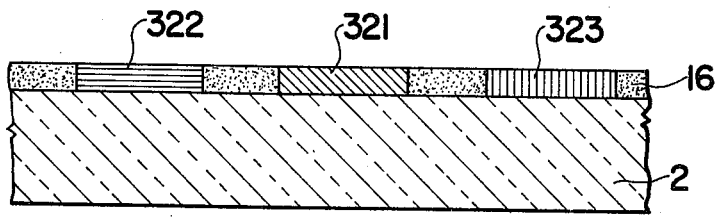

METHOD FOR FORMING FLUORESCENT SCREEN OF COLOR CATHODE RAY TUBES USING FILTER LAYER

BACKGROUND OF THE INVENTION

1. Field of the Invention

This invention relates to a novel method for forming a fluorescent screen of a color cathode ray tube and more particularly to a novel method for forming fluorescent screen having phosphor elements with good adhesion and position to produce a good color picture.

2. Disclosure of Prior Art

A commercial color picture tube for color television receiving, or a color kinescope as it is sometimes called, is a cathode ray tube which includes a viewing screen generally comprised of a multiplicity of red-emitting, green-emitting and blue-emitting phosphor elements of the primary colors. These elements are usually arranged on the screen of a faceplate panel of the tube in a regular cycle array. In a color cathode ray tube having a color selecting mask, the phosphor elements are usually dots, continual strip pieces or continuous strip pieces arranged in groups of threes or triads. Each triad is associated with a particular perforated aperture in the color selecting mask (also called mask).

Recently, it is getting more popular that the color cathode ray tube have a screen comprising a light absorbing matrix lying in the space between the phosphor elements.

Depositing the multiplicity of phosphor elements on the screen of the color cathode ray tube presents difficult problems of fabrication. One useful processing technique contemplates that the entire screen area is covered with the phosphor of one of the primary colors and a photosensitive resist. After the screen has been coated with such materials, it is placed in so-called "lighthouse" in which a high intensity light exposes the screen through the mask that ultimately is assembled with the screen in the completed tube. By positioning the light source to simulate the action of an electron gun associated with the phosphor being processed, an exposure pattern results which corresponds to the desired location of the elements of the phosphor being processed. After exposure, the screen may be developed (washing) to remove unexposed portion of the coating and leave as a residue the phosphor elements of one of the primary colors.

Repetition of the same general process permits depositing elements of the other phosphors although it will be understood that the coating in each step of the process includes a phosphor of a given color and its exposure in the lighthouse is with a light source properly positioned to simulate the electron gun assigned to that color.

This processing can be satisfactorily employed except that there are certain difficult problems in the adhesion of the elements to the faceplate panel of the tube. If the exposure is extended, this adhesion will be increased but an undesired enlargement of certain of the phosphor elements will be effected.

In the process for forming the light absorbing matrix on the faceplate panel, difficult problems equivalent to that of the phosphor elements occur in preparing removable elements made usually of photosensitive material in which the removable elements are available to provide holes in the light absorbing matrix. In other words, the removable elements are required to be the same as the phosphor elements to be formed, because the holes in the light absorbing matrix determine the size and position of the effective phosphor elements of a completed fluorescent screen of the tube.

Another exposure process technique so-called "back exposure" has been proposed. In this back exposure technique, as heretofore carried out, the screen is also exposed from the side of the faceplate panel opposite to that side which bears the screening coating. As the back exposure increases, to some extent, the effect of the forward exposure through the mask, it may overcome the problems of the poor adhesion raised in the forward exposure but it may also introduce an undesired phosphor depositing on the screen area of a certain phosphor element which will be deposited thereafter, consequently the color purity of the phosphor elements deteriorates. This added back exposure may further cause an undesired enlargement of certain phosphor elements. Thus, this back exposure technique has been impractical.

Accordingly, it is an object of the invention to provide a novel method for forming a fluorescent screen of a color cathode ray tube which avoids the aforementioned problems of the prior art.

It is other object of the invention to provide a novel method for preparing a light absorbing matrix with desired holes.

SUMMARY OF THE INVENTION

In a screening process of a color cathode ray tube having mask (equivalent to the color selecting mask of the prior art), in accordance with the invention, the inner surface of the faceplate panel is coated with a layer of filter-forming material and a layer of screening material in this order and then the screen area is forwardly exposed, through the mask of the tube, to a actinic radiation to which at least the filter-forming material layer is responsive. Successively, the screen area is backwardly exposed, through the faceplate panel and the filter layer of forwardly exposed portions, to other actinic radiation to which the layer of screening material is only responsive.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the figures of which like reference numerals identify like elements, and in which, FIG. 1 is a schematic view of an exposure device on which the exposure step of the novel method may be practiced. The exposure device has a faceplate panel thereon in position for exposure;

FIG. 2 is a sectional view of the light source means which is modified for back exposure of this invention;

FIGS. 3 to 8 are fragmentary views representing various steps of the screening process pertaining to one embodiment of the subject invention;

FIGS. 9 to 15 are fragmentary views representing various steps of the screening process pertaining to another embodiment of the subject invention; and FIGS. 16 and 17 are sectional views useful for explaining other embodiments of the subject invention.

DETAILED DESCRIPTION OF THE PREFERRED EMBODIMENTS

Figure 3:
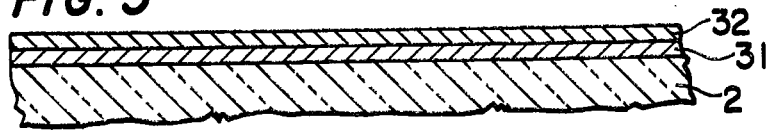

The exposure device (lighthouse) utilized in the method of the present invention, shown in FIG. 1, comprises a housing 1 on which there is provided a faceplate panel 2 of a color cathode ray tube to be manufactured. A mask 3 comprising a pattern of perforated apertures 4 is provided on one side of the faceplate panel 2. The faceplate panel 2 comprises a coatings 5 of a filter-forming coating and a screening coating on a glass panel. The pattern of perforated apertures 4 is projected on the coating 5 by means of the forward exposure means 6 emitting actinic radiation ray 7. Also, the coating 5 is exposed through the panel 2 to another actinic radiation ray 8 from the back exposure means 9. The exposure device may comprise a correction lens means 10 that serves for simulating the actinic radiation ray 7 to the locus of electron beam emitted from an electron gun (not shown) in a completed color cathode ray tube.

A modified source means for back exposure shown in FIG. 2 comprises a concave reflecting surface 21 for reflecting the radiation ray emitted from the ray generating source 22. Such source means is more practical for back exposure of the present invention, but it will be understood that it is the most preferable that there is the ray 8 on the extended line of the ray 7 of the forward exposure.

General Process

The subject of the novel method defined by the present invention is that a desired portion of the coating of the screening material, e.g. photosensitive phosphor material or photoresist material, is exposed through the coating of the filter-forming material interposed between the faceplate panel and the coating of the screening material to a particular actinic radiation ray of the back exposure. More specifically, an organic composition for preparing the filter-forming layer is coated uniformly on the inner surface of the faceplate panel. Said organic composition is a mixture of a solvent, for example acetone, a vehicle such as nitrocellulose, and a compound of cyanin dyes or azo dyes, e.g. dimethyl-dicarbocyaninepara-toluene-sulfonate or diazo-stilbene or tetrazo-stilbene. (The mixture comprises 1–5 weight percent of a vehicle, 10–30 weight percent per provided vehicle of dye, and the remaining of a solvent.) After the coating has been dried, the filter-forming layer presents an opaque state to an actinic radiation ray whose wavelength is 4,000 to 5,000 angstroms (which is known as visible ray), but it may be turned into a transparent state to the visible ray by subjecting to an actinic radiation ray whose wavelength is 3,500 to 4,000 angstroms (known as ultraviolet ray). It has been found that this phenomenon is an action taking place between the ultraviolet ray and a cyanin compound in the cyanin dyes or an azo base compound in the azo dyes.

Additional suitable dye, vehicle and solvent;

Dye (cyanine) 1,1' diethyl-quino-carbocyanine iodide,
(azo) P-diazodimethylaniline zinc chloride,
P-diazo-N-ethyl-N-hydroxyethylaniline zinc chloride,
4-diazo-2,5diethoxymorpholinobenzene zinc chloride.

Vehicle cellulose acetate,
polyvinyl acetate,
acrylic resin.

Solvent toluene

The screening coating is coated on the filter layer. The screening coating is compounded from a slurry of phosphor of one of the primary colors and a photoresist comprising polyvinyl alcohol (PVA) and ammonium dichromate.

The slurry employing for each color in the present invention is conventional and is not special. The typical slurry for each color will be described:

The slurry for green color comprises 2 weight percent of PVA, 5 weight percent per provided PVA of ammonium dichromate (ADC), 25 weight percent of zinc sulfide:copper (ZnS:Cu) and the remaining of water.

The slurry for blue color comprises 2 weight percent of PVA, 7 weight percent per provided PVA of ADC, 30 weight percent of zinc sulfide:silver (ZnS:Ag) and the remaining of water.

The slurry for red color comprises 2 weight percent of PVA, 10 weight percent per provided PVA of ADC, 20 weight percent of yttrium oxysulfide:europium ($Y_2O_2S$:Eu) and the remaining of water.

Otherwise, in preparing a light absorbing matrix, the screening coating is available to form removable elements. After the coating of screening material has been dried, the screening coating is exposed selectively through the mask to the ultraviolet ray emitted from the forward exposure device. At the same time, the filter layer is exposed together with the selected portion of the screening layer so that the exposed portions of the filter layer is turned into a transparent state. Then the screening layer is successively exposed through the faceplate panel and the transparent state portions of the filter layer to the visible ray emitted from the back exposure means. It is available and practical that the visible ray for the back exposure is obtained from an incandescent bulb or a fluorescent light lamp. It is effective to reduce the entire exposure time by effecting the forward exposure during the back exposure. And also it is possible to start the both exposures at the same time. After exposure, the screening layer is developed to remove the unsaturated exposed layer and to leave as a residue the elements corresponding to one of the primary colors. In preparing removable elements of photoresist material for forming a light absorbing matrix, all removable elements corresponding to each of primary colors is exposed before the developing step.

Repetition of the same general process from the step of coating with the slurry to the step of developing of the screening layer, permits depositing elements of the other phosphors although it will be understood that coating in each step of the method includes a phosphor of a given color and its forward exposure in the exposure device (lighthouse) is with a radiation source properly positioned to simulate the electron gun assigned to that color.

The filter layer will be decomposed and vaporized by subjecting to a heat treatment in a process that follows specific embodiments which will be described hereinafter:

EXAMPLE 1

Figure 4:
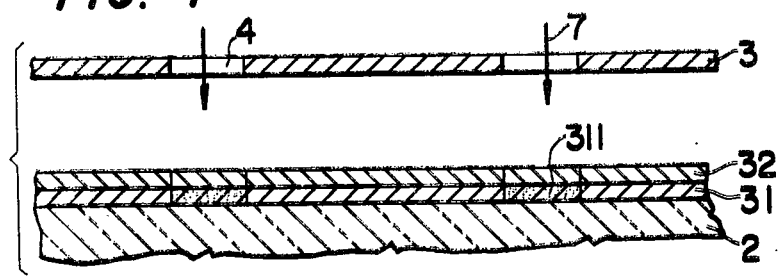
Figure 5:
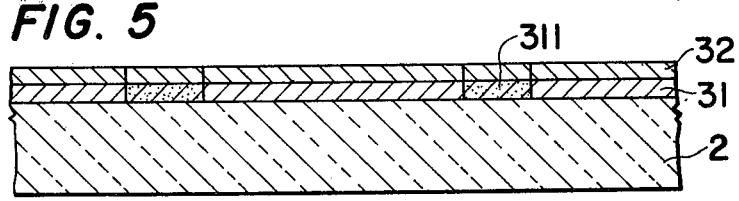
Figure 6:
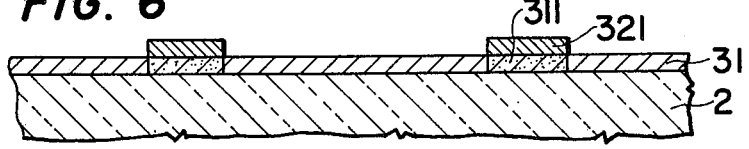

Initially, the screen of the faceplate may be made chemically clean, if necessary. It is coated with a filter coating 31 on the inner surface of the faceplate panel 2. The filter coating comprises 0.5 weight percent of dimethyl-dicarbocyanine-para-toluene-sulfonate, 3 weight percent of nitrocellulose which serves as a vehicle and 96.5 weight percent of acetone which serves as a solvent. It is preferable that the filter layer 31 has a 1,000 to 4,000 angstroms thickness. After the filter coating has been dried, the filter layer 31 is coated with a slurry 32 of photosensitive material in a conventional manner. The slurry comprises a phosphor of one of the primary colors and a photoresist such as the aqueous solution of 1~5 weight percent of polyvinyl alcohol(-PVA) and 5~10 weight percent per provided polyvinyl alcohol of ammonium dichromate (FIG. 3). After the slurry coating has been dried, the coating is forwarly exposed through the mask 3 to an ultraviolet ray 7. This exposure is conducted for about three minutes with the intensity of illumination of 500 Lx. at the phosphor layer 32. The exposed portions 311 of the filter layer 31 are turned into a transparent state (FIG. 4). Succeedingly, the phosphor layer 32 is backwardly exposed through the faceplate panel 2 and the transparent state portion 311 of the filter layer 31 to a visible ray 8. This back exposure is conducted for about one minute with the intensity of illumination of 2,000 Lx. at the phosphor layer (FIG. 5). After those exposures, the screen is developed to remove an unsaturated exposed portion of the phosphor layer 32 to leave as a residue the phosphor elements 321 of one of the primary colors (FIG. 6).

Figure 7:
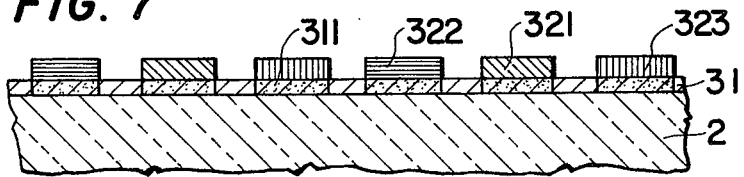

Repetition of the same process from the slurry coating to the developing step permits phosphor elements 322 and 323 of the other colors (FIG. 7). The completed fluorescent screen shown in FIG. 8 is obtained by decomposing the filter layer with a heat treatment at a temperature from 400° to 430° C.

If necesary, it may be deposited with a metal layer such as aluminum on the fluorescent screen of the faceplate panel to form a metallized fluorescent screen.

Employing the filter layer for preparing a light absorbing matrix on the screen will be described in EXAMPLE 2.

EXAMPLE 2

Firstly, the screen of the faceplate panel may be made chemically clean, if necessary. The same filter layer 31 of Example 1 and a removable layer 91 of a photoresist of polyvinyl alcohol (PVA) and ammonium dichromate of the type used in Example 1 are prepared on the screen (FIG. 9). The removable layer 91 is forwardly exposed through the mask 3 to an ultraviolet ray 7 (FIG. 10). Such an exposed portion corresponds with a position where the phosphor elements will be deposited. The same forward exposures are carried out respectively about other elements corresponding to other phosphors of the primary colors with the respective radiation source properly positioned to simulate the electron gun assigned to that color. After those forward exposures have been done, the removable layer 91 is backwardly exposed through the faceplate panel and the transparent state portions 311 of the filter layer 31 to a visible ray 9 (FIG. 11). Then the removable layer 91 is developed to remove unsaturatedly exposed portions of the removable layer 91 and to leave a residue 911 of the saturated exposed portions of the removable layer 91 corresponding to the portions of the phosphor elements (FIG. 12). Then a light absorbing coating 13 comprising carbon black or graphite is coated on the screen (FIG. 13). After the light absorbing coating has been dried, the screen is made porous with an aqueous solution of hydrogen peroxide to remove the removable elements 911 together with the light absorbing layer 13 lying on the removable elements 911 and to leave the light absorbing layer 131 as a residue on the light absorbing matrix 16 with a plurality of holes 14 in which the phosphors will be embedded (FIG. 14). The suitable light absorbing matrix 16 shown in FIG. 15 is obtained by decomposing the filter layer with a heat treatment of a temperature from 400° to 430° C.

Employing the filter layer for depositing phosphor elements on the screen provided with a light absorbing matrix will be explained in Example 3.

EXAMPLE 3

After formation of a light absorbing matrix, the preparation of the filter layer and the deposition of phosphor of the primary colors are performed with the same way as described in Example 1. More practically, the filter layer 31 and photosensitive phosphor layer 32 of one of the primary colors are formed on the screen of the faceplate panel 2 provided with the light absorbing matrix 16 whose formation is not limited by the process described in Example 2. The photosensitive phosphor layer 32 is forwardly exposing through the mask 3 to ultraviolet ray 7 and then, backwardly exposing through the faceplate panel 2 and the forwardly exposed portions of the filter layer 31 to visible ray 8. After those exposures, the photosensitive phosphor layer 32 is developed to remove unsaturated exposed portions of the photosensitive phosphor layer and to leave as a residue the phosphor elements (FIG. 16).

By repeating the same process of deposition of a phosphor with other phosphors of the primary colors there is obtained a completed light absorbing matrix type fluorescent screen in which respective phosphor elements 321, 322 and 323 of the primary colors are embedded in holes of the light absorbing matrix 16 (FIG. 17).

In accordance with the novel method of the present invention, the back exposure is carried out through the filter layer intercepting the radiation passing of an undesired portion thereof, so that the disadvantages of the prior art can be avoided and the profits of the back exposure can be more promoted. Thus, the emitted colors from respective phosphor elements are real. An undesired enlargement of the phosphor elements can be avoided perfectly. The reproduction of true colored picture becomes possible. Further, lower exposure times and good element adhesion becomes possible.

Otherwise, it may be effective to use the photochromic characteristic of other material as the filter action in accordance with the present invention.

While particular embodiments of the invention have been shown and described, it will be obvious to those skilled in the art that changes and modifications can be made in its broader aspects, and, therefore, the aim in the appended claims is to cover all such changes and modifications as fall within the true spirit and scope of the invention.

What is claimed is:

1. A method for preparing a plurality of screen elements on a faceplate panel of a color cathode ray tube having a color selecting mask, said method comprises the steps of:

coating a filter layer being responsive to only a first actinic radiation on a faceplate panel of the tube, said filter layer including an organic vehicle and an organic filter material that is turned into a transparent state to a second actinic radiation by exposing to a first actinic radiation;

overcoating a photosensitive screening layer on said filter layer, forwardly exposing said filter layer through a color selecting mask to the first actinic radiation for turning the exposed portions of the filter layer into a transparent state and for turning the exposed portion of the photosensitive layer into a water-insoluble state cooperating with exposing to the second actinic radiation, backwardly exposing said photosensitive screening layer through the panel and said filter layer of forward exposed portions to the second actinic radiation to which the photosensitive screening layer is responsive, and developing said screen to remove unsaturated exposed portions of the photosensitive screening layer, and to provide said screen elements thereon.

2. The method for preparing the screen elements according to claim 1, wherein said filter material is selected from the group consisting of cyanin dyes and azo dyes.

3. The method for preparing the screen elements according to claim 1, wherein said photosensitive screening layer includes a phosphor of one of the primary colors to be applied to said tube.

4. The method for preparing the screen elements according to claim 1, wherein said method after the developing step, comprises the further steps of:

coating a light absorbing layer on the screen provided with the remaining photosensitive screening elements, and removing said remaining photosensitive screening elements together with the light absorbing layer on said elements.

5. The method for preparing the screen elements according to claim 2, wherein said first and second actinic radiation are ultraviolet ray and visible ray, respectively.

6. The method for preparing the screen elements according to claim 2, wherein said filter material is dimethyl-dicarbocyanine-para-toluene-sulfonate.

7. The method for preparing the screen elements according to claim 2, wherein said filter material is diazostilbene.

8. The method for preparing the screen elements according to claim 2, wherein said filter material is tetrazostilbene.

9. The method for preparing the screen elements according to claim 3, wherein a light absorbing matrix is formed on the faceplate prior to said step of coating the filter layer.

10. A method for depositing phosphor elements on a screen of a panel of a color cathode ray tube having a color selecting mask, said method comprises the steps of:

coating a filter layer that is responsive to only a first actinic radiation on the faceplate panel of the tube, said filter layer including an organic vehicle and an organic filter material that is turned into a transparent state to a second actinic radiation by exposing to a first actinic radiation;

overcoating a photosensitive phosphor layer of one of the primary colors on said filter layer, forwardly exposing said filter layer through the color selecting mask to the first actinic radiation for turning the exposed portions of the filter layer into a transparent state and for turning the exposed portion of the photosensitive layer into a water-insoluble state cooperating with exposing to the second actinic radiation, backwardly exposing said photosensitive phosphor layer through the panel and said filter layer of forward exposed portions to the second actinic radiation to which the photosensitive phosphor layer is responsive, developing said screen to remove unsaturated exposed portions of said photosensitive phosphor layer, and repeating the deposition steps for each of the other phosphors of the primary colors.

11. A method for forming a light absorbing matrix surrounding phosphor elements on a screen of a panel of a color cathode ray tube having a color selecting mask, said method comprises the steps of:

coating a filter layer that is responsive to only a first actinic radiation on the faceplate panel of the tube, said filter layer including an organic vehicle and an organic filter material that is turned into a transparent state to a second actinic radiation by exposing to a first actinic radiation, overcoating a photoresist layer on said filter layer, forwardly exposing said filter layer through the color selecting mask to the first actinic radiation about one color of the primary colors for turning the exposed portions of the filter layer into a transparent state and for turning the exposed portion of the photosensitive layer into a water-insoluble state cooperating with exposing to the second actinic radiation, backwardly exposing said photoresist layer through the panel and said filter layer to a second actinic radiation to which the photoresist layer is responsive, developing said screen to remove unsaturated exposed portions of said photoresist layer, coating a light absorbing layer on the screen provided with photoresist elements, removing said photoresist elements and said light absorbing layer lying on said photoresist elements, and heating said screen to remove said filter layer to thereby provide a light absorbing matrix on said tube.

12. A method for depositing a phosphor element on a screen of a panel of a color cathode ray tube having a color selecting mask, said method comprises the steps of:

coating a filter layer that is responsive to only a first actinic radiation on the screen provided with a light absorbing matrix thereon, said filter layer including an organic vehicle and an organic filter material that is turned into a transparent state to a second actinic radiation by exposing to a first actinic radiation, overcoating a photosensitive phosphor layer of one of the primary colors on said filter layer, forwardly exposing said filter layer through a color selecting mask to the first actinic radiation for turning the exposed portions of the filter layer into a transparent state and for turning the exposed portion of the photosensitive layer into a water-insoluble state cooperating with exposing to the second actinic radiation, backwardly exposing said photosensitive phosphor layer through the panel and said filter layer of forwardly exposed portions to the second actinic radiation to which the photosensitive phosphor layer is responsive, developing said screen to remove unsaturated exposed portions of said photosensitive phosphor layer, and repeating the deposition step for each of the other phosphors of the primary colors.

13. The method for preparing the screen elements according to claim 1, wherein said organic vehicle is selected from the group consisting of nitrocellulose, cellulose acetate, polyvinyl acetate, and acrylic resin.

14. The method for preparing the screen elements according to claim 10, wherein said organic vehicle is selected from the group consisting of nitrocellulose, cellulose acetate, polyvinyl acetate, and acrylic resin and said filter material is selected from the group consisting of cynanin dyes and azo dyes.

15. The method for preparing the screen elements according to claim 11, wherein said organic vehicle is selected from the group consisting of nitrocellulose, cellulose acetate, polyvinyl acetate, and acrylic resin and said filter material is selected from the group consisting of cynanin dyes and azo dyes.

16. The method for preparing the screen elements according to claim 12, wherein said organic vehicle is selected from the group consisting of nitrocellulose, cellulose acetate, polyvinyl acetate, and acrylic resin and said filter material is selected from the group consisting of cynanin dyes and azo dyes.

* * * * *